(12) United States Patent
Okita (10) Patent No.: US 6,351,107 B1
(45) Date of Patent: Feb. 26, 2002

(54) DRIVING DEVICE OF SWITCHING ELEMENT IN POWER CONVERSION DEVICE USING CURRENT CONTROL SEMICONDUCTOR SWITCHING ELEMENT

(75) Inventor: Yoshihisa Okita, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/612,343

(22) Filed: Jul. 6, 2000

(30) Foreign Application Priority Data

| Jul. 8, 1999 | (JP) | 11-194757 |
| Jul. 29, 1999 | (JP) | 11-215203 |

(51) Int. Cl.[7] .............................................. G05F 1/40
(52) U.S. Cl. ...................................... 323/282; 323/289
(58) Field of Search ................................. 323/265, 270, 323/271, 273, 275, 282, 285, 289; 327/365, 478, 530, 538

(56) References Cited

U.S. PATENT DOCUMENTS

| 4,096,429 A | * | 6/1978 | Carter | 323/282 |
| 4,430,608 A | * | 2/1984 | Nester | 323/282 |
| 5,021,936 A | | 6/1991 | Nishizawa et al. | |
| 5,094,333 A | * | 3/1992 | Mimura | 192/84 R |
| 5,838,147 A | * | 11/1998 | Suzuki et al. | 323/289 |
| 6,144,245 A | * | 11/2000 | Balogh | 327/280 |

FOREIGN PATENT DOCUMENTS

| JP | 53-41729 | 4/1978 |
| JP | 01-97173 | 4/1989 |

OTHER PUBLICATIONS

"Synchronous Rectifier Using Bipolar Transistor Driven by Current Transformer", Eiji Sakai and Koosuke Harada, Transaction of the Institute of Electronic Information and Communication, vol. J74–B–1, No. 8, Aug. 1991, pp. 639 to 646.

"Synchronous Rectifier Using Bipolar Transistor Driven by Current Transformer", Eiji Sakai and Koosuke Harada, 1990, pp. 30–37.

"Development of a High Efficiency Inverter Without Audible Noise", Isao Takahashi and Jun–ichi Itoh, T.IEE Japan, vol. 116–D, No. 12, 1996, pp. 1205–1210.

"How to Get 99% Inverter Efficiency", Isao Takahashi et al, 0–7803–1993–1/94, 1994 IEEE, pp. 971–976.

* cited by examiner

*Primary Examiner*—Matthew Nguyen
(74) *Attorney, Agent, or Firm*—Frishauf, Holtz, Goodman, Langer & Chick, P.C.

(57) ABSTRACT

In a power conversion device including a current control semiconductor switching element, a driving device of the aforementioned switching element is disclosed. The driving device comprises an output main line connected to a base or gate of the switching element, an output return line connected to an emitter or source. A collector current detecting device for detecting a collector current or drain current, and a base current control device for controlling a base current or gate current are provided. The base current control device controls the base current to reduce the sum of conduction loss and drive power in the switching element in accordance with a collector current signal from the collector current detecting device.

9 Claims, 10 Drawing Sheets

FIG. 5(a) Turn-On    FIG. 5(b) Turn-Off

DRIVING DEVICE OF SWITCHING ELEMENT IN POWER CONVERSION DEVICE USING CURRENT CONTROL SEMICONDUCTOR SWITCHING ELEMENT

FIELD OF THE INVENTION

The present invention relates to a switching element driving device for a power conversion device including current control semiconductor switching elements. In particular, the present invention relates to a technology of achieving an improved power conversion efficiency in such power conversion device including semiconductor switching elements.

BACKGROUND OF THE INVENTION

A power conversion device including semiconductor switching elements has widely been used from the standpoint of efficient utilization of energy due to its excellent characteristics in power conversion efficiency. Example of the semiconductor switching elements include voltage-driven type elements, such as insulated-gate bipolar transistors (IGBT), static-induction type transistors, field-effect transistors (FET), and current-driven type elements, such as bipolar-mode static-induction type transistors (BSIT) and bipolar junction transistors (BJT).

The voltage driven type elements can be directly driven by voltage signals, so that their driving circuit may readily be simplified and their drive frequency may also be set higher. In applications which require 250V or more of withstand voltage, several types of switching elements are selectively used depending on the capacity and drive frequency required. Specifically, as switching elements for use in the drive frequency range of several KHz to several hundred KHz, use has widely been made of IGBTs which have an excellent overall balance between a voltage drop under ON state and a switching performance and of FETs which have a small current capacity but capable of high speed operation.

On the other hand, since the current-driven switching element is driven by applying current to its control terminal, the driving circuit often becomes complicated and the switching speed is generally lower as compared with a voltage-driven type element. However, the current-driven switching elements have a characteristic that the voltage drop under ON state is about one-third to one-sixth of the voltage-driven element. Therefore, it can be concluded that the current-driven switching element is suited to reduction in size of the power conversion device.

Thus, semiconductor switching elements usable for power conversion devices can be classified broadly into two types. Among these types, from the standpoint of size reduction of components, simplification of circuits, size reduction by high frequency driving, and cost reduction and so on, there is an increasing tendency of using voltage-driven switching elements which have a lower switching loss and a capability of being easily driven in high frequency range. However, in order to comply with social needs for achieving further improvements in efficiency and size reduction over the future, the level of voltage drop under ON state of the voltage-driven type element would be an obstacle as long as the current technologies using the voltage-driven switching elements are continued to be adopted. In particular, observing the current situation, the voltage drop under an ON state of an IGBT or the like, which is the most widely used one among voltage-driven switching elements, has already been improved closely up to a theoretical value. Thus, the technology has already been reached a highest accomplishment, so that there would be no hope in an effort to achieve a substantial reduction in the conduction loss.

As to the switching loss, developments have been made in a loss recovery technology utilizing a resonance phenomenon and a soft switching technology for the purpose of both the prevention of electromagnetic environmental pollution and the reduction of power loss. On the other hand, a conduction loss is always produced in a semiconductor switching element whenever current passes through the element and the amount of the loss depends on the characteristics of the element, so that it would not be easy to reduce the conduction loss only through a simple improvement but would require radical review of circuit topology.

In the technical field of the power conversion device, various efforts are still continued with aiming at size reduction of the device as a whole, obtaining a high power/high density device, and accomplishing a higher efficiency, and so on.

There are two primary losses produced in semiconductor switching elements of a power conversion device, one being a switching loss generated while the semiconductor switching element is moved from an ON state to an OFF state or from an OFF state to an ON state, the other being a conduction loss caused by a voltage drop produced in the semiconductor switching element when the semiconductor switching element is in the ON state. In order to comply with the requirements of making a power conversion device more compact than existing ones provide a device of higher output power and higher density, to thereby obtain a power conversion device meeting with the needs, it is necessary to develop a technology capable of accomplishing high efficiency by comprehensively reducing both the aforementioned conduction loss caused by the voltage drop under ON state of the semiconductor switching element and the switching loss which together lead to a power loss.

Under the above circumstances, there are very few examples reporting that the conduction loss in a semiconductor switching element has been reduced through an effective improvement in circuitry. Referring to examples among these reports, Japanese Patent Laid-Open Publication No. Hei 1-97173 discloses a technology for reducing both switching loss and conduction loss in a PWM full bridge power conversion device such as a PWM inverter by providing a semiconductor switching element having small conduction loss, such as a bipolar transistor, in an arm adapted to be switched under a commercial-frequency, and a semiconductor switching element having small switching loss, such as static-induction transistor, in an arm adapted to be switched under a high-frequency. The Transactions of the Institute of Electrical Engineering of Japan (T. IEE Japan), Vol. 116D, No12 (1996), also discloses a circuitry improvement for reducing conduction losses in a power conversion device using semiconductor switching elements. However, these prior art technologies still include problems in that adequate investigations have not been made in respect of optimization of conduction loss, reduction of loss in the driving circuit and size reduction, and that there is practically limitations in the driving frequency. For example, the aforementioned Japanese Laid-Open Publication includes no specific teaching about method for driving the bipolar transistor which is of a current control type switching element. However, when a constant current is applied to the base as in a conventional method for driving a transistor, the efficiency under a light load condition would particularly become low due to the driving loss in no load condition or light load condition. In the technology described in the aforementioned Transactions of the Institute of Electrical Engineers of Japan, drive power is supplied to a transistor by a CT (current transformer) which is connected to the collector of the transistor, so that the base current is determined by the winding ratio of the aforementioned CT. Therefore, it is required that the circuit is to be designed in consideration of the minimum value of current amplification factor of the semiconductor switching element. As the result, there is a possibility that the CT is driven up to a supersaturated state in low load. Besides, the technology is effective only under a relatively high frequency due the use of the CT.

SUMMARY OF THE INVENTION

Under these circumstances, it is an object of the present invention to provide a power conversion device including a semiconductor switching element and capable of achieving high efficiency by totally reducing the switching loss and the conduction loss produced at the switching element.

In order to accomplish the above and other objects, the present invention proposes to detect the collector current or drain current in the semiconductor switching element of the power conversion device, and control the base current to reduce the sum of the conduction loss and the drive power in the aforementioned switching element in accordance with the detected value.

More particularly, according to the present invention, there is provided a switching element driving device for a power conversion device including a current control type semiconductor switching element which has a collector or drain, an emitter or source, and a base or gate. The driving device comprises an output main line connected to the base or gate of the switching element, an output return line connected to the emitter or source, a collector current detecting device for detecting a collector current or drain current, and a base current control device for controlling a base current or gate current. The base current control device controls the base current to reduce the sum of conduction loss and drive power in the switching element in accordance with a collector current signal from the collector current detecting device.

In one aspect of the present invention, the driving device further comprises an element-drive power supply for providing a current for driving the switching element, and a reverse bias power supply for applying a reverse bias to the base or gate of the switching element. The base current control device includes an ON-drive switch device for connecting the element-drive power supply to the base or gate of the switching element, an OFF-drive switch device for connecting the reverse bias power supply to the base or gate of the switching element, an operation device for receiving the collector current signal from the collector current detecting device and performing an arithmetical operation to obtain the base current. Further, the ON-drive switch device is held in a conducting state and the OFF-drive switch device is held in a non-conductive state when the switching element is to be turned on. The OFF-drive switch device is then held in a conducting state and the ON-drive switch device is held in a non-conductive state when the switching element is to be turned off, so that the reverse bias from the reverse bias power supply is applied for a rapid OFF operation of the switching element.

According to another aspect of the present invention, the base current control device stores a data of optimum base current with respect to the collector current which is specific to the particular switching element, and includes a base current determining device for determining the base current value, on the basis of the stored data, in accordance with the collector current signal from the collector current detecting device, and a current control device for applying the base current to the base or gate of the switching element in accordance with a signal from the base current determining device.

In a specific aspect of the present invention, the base current control device stores the data of optimum base current corresponding to various different temperatures. Further, there is provided a temperature detecting device for detecting a temperature of the switching element, the determining device of the base current control device being adapted to determine the base current value, on the basis of the stored data, in accordance with to the collector current signal from the collector current detecting device and a temperature signal from the temperature detecting device.

The determining device may be configured to perform an arithmetical operation to obtain the base current which minimizes the sum of the conduction loss and the drive power of the switching element and then to multiply the value thus obtained by a coefficient greater than 1 to provide an output to the current control device. The determining device may also be configured to perform an arithmetical operation to obtain the base current which minimizes the sum of the conduction loss and the drive power of the switching element and then to add a constant current value to the value thus obtained to provide an output to the current control device. The determining device may, alternatively, be configured to perform an arithmetical operation to obtain the base current which minimizes the sum of the conduction loss and the drive power of the switching element and then to multiply the value thus obtained by a coefficient greater than 1 in conjunction with adding a constant current value thereto to provide an output to the current control device. The current control device may include a switch device for controlling the base current of the aforementioned switching element and a rectifying device provided in the output portion of the switch device. The rectifying device may be of a synchronous type including a rectifying element and an auxiliary rectifying element which has a lower conduction resistance than the switch device. A base current detecting device for detecting the base current of the switching element may further be provided and this base current detecting device may be configured to regulate the base current signal from the base current control device in accordance with a base current command signal which is obtained in accordance with the collector current signal from the aforementioned collector current detecting device.

DESCRIPTION OF THE PREFERRED EMBODIMENT

Figure 1:
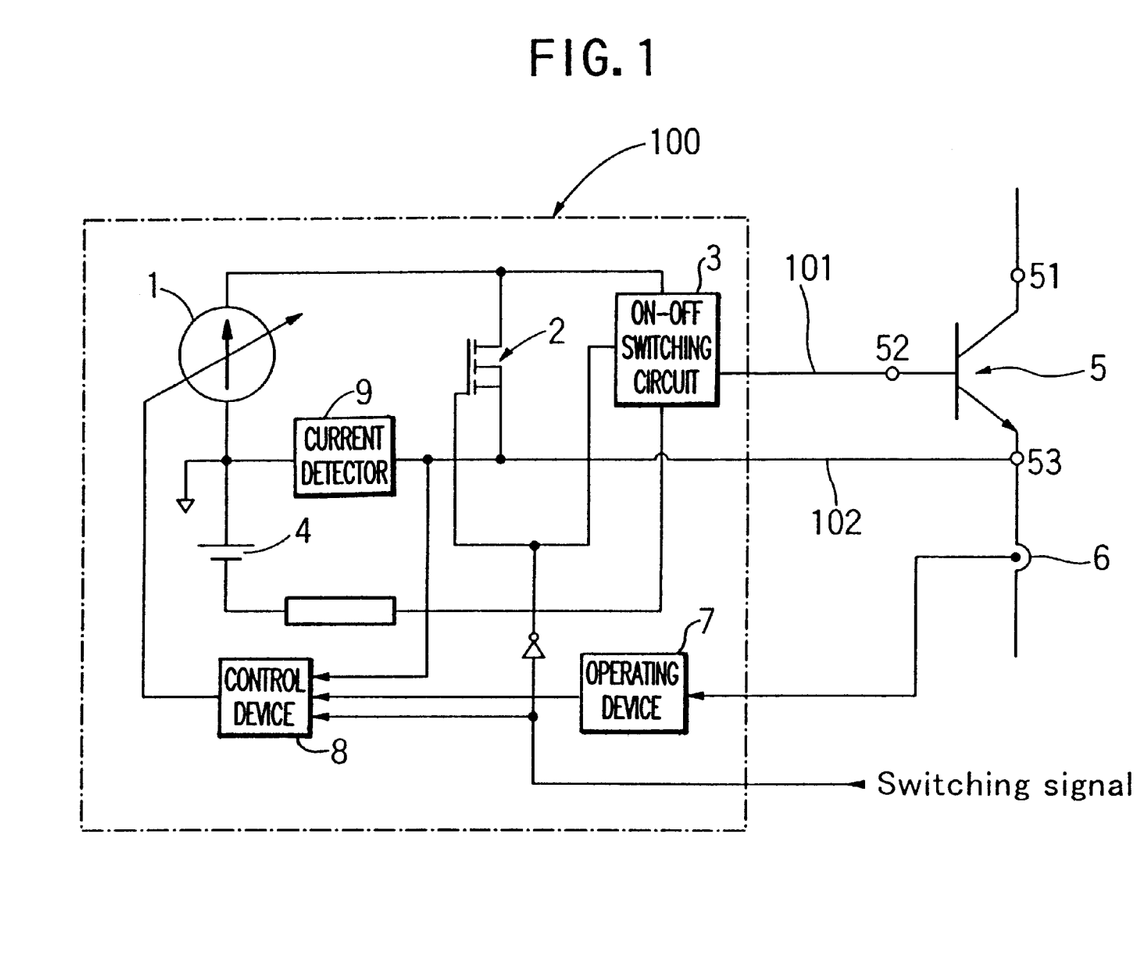
FIG. 1 is a circuit diagram showing a driving circuit of a switching element according to one embodiment of the present invention.

Embodiments of the present invention will now be described taking reference to the drawings. Referring first to FIG. 1, there is provided a transistor 5 which is a current control type semiconductor switching element comprising a collector 51, a base 52 and an emitter 53. A driving circuit 100 has an output main line 101 connected to the base 52 of the transistor 5.

The driving circuit 100 includes a current source 1 whose output current can be controlled by a signal from outside, a shunt switch 2, and an on-off switching circuit 3. The shunt switch 2 and the on-off switching circuit 3 are connected in parallel between a positive and negative terminals of the current source 1 respectively. The on-off switching circuit 3 has an output connected to the output main line 101 of the driving circuit 100. The driving circuit 100 has an output return line 102 which is connected on one hand to the emitter 53 of the transistor 5 and on the other hand to the negative terminal of the current source 1. The driving circuit 100 also includes a reverse bias power supply 4 which is connected between the negative terminal of the current source 1 and the shunt switch 2.

A current detector 6 is provided for detecting the collector current of the transistor 5, and has an output connected to a base current command value operating device 7. The operating device 7 has an output connected to a control device 8 which produces a control signal for controlling the output current of the current source 1. A current detector 9 is also provided in a line which connects the shunt switch 2 and the point of connection between the current source 1 and the reverse bias power supply 4.

Figure 2:
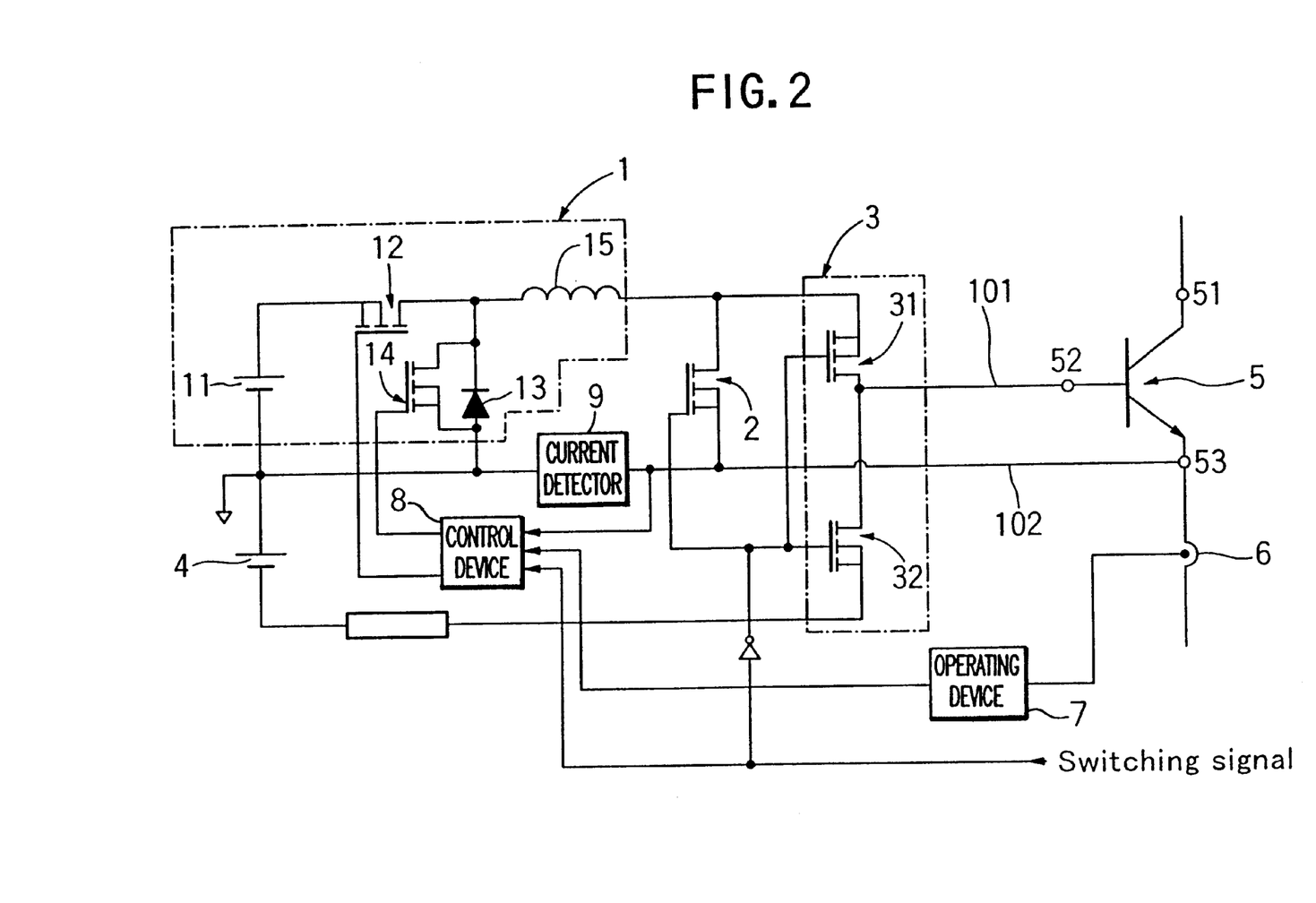
FIG. 2 is a circuit diagram showing further details about the driving circuit of FIG. 1.

FIG. 2 shows further details of the circuit shown in FIG. 1. The current source 1 comprises a voltage source 11, a switching element 12, a rectifying element 13, an auxiliary rectifying element 14, and an inductor 15. The switching element 12 and the inductor 15 are connected in series to the voltage source 11. The rectifying element 13 and the auxiliary rectifying element 14 are connected to the point of connection between the switching element 12 and the inductor 15. The rectifying element 13 is composed of a diode and the auxiliary rectifying element 14 is, for example, composed of a field-effect transistor (FET). This auxiliary rectifying element 14 can reduce a loss in the rectifying element 13 by virtue of its synchronous rectifying function. When an FET is used as the auxiliary rectifying element 14, a parasitic diode of the FET may substitutes for the rectifying element 13.

The on-off switching circuit 3 is composed of a positive side switch 31 and a negative side switch 32, which are connected in series each other. The positive side switch 31 is connected to the inductor 15, and the negative side switch 32 is connected to the voltage source 4. The output main line 101 of the driving circuit 100 is connected to a connection between the positive side switch 31 and the negative side switch 32.

An operation of the driving circuit 100 shown in FIG. 1 and FIG. 2 will be described below. Firstly, in ON condition of the driving circuit 100 the positive side switch 31 of the switching circuit 3 is turn on and the negative side switch 32 of the switching circuit 3 is turned off, by a switching signal provided from outside. The shunt switch 2 is switched to OFF and the output of the driving circuit 100 is applied to the base of the transistor 5 through the output main line 101 so that the transistor 5 is retained in ON condition. The current detector 6 detects the collector current of the transistor 5 and generates a current signal which is applied to the current command value operating device 7. On the basis of this detected signal, the operating device 7 performs an arithmetic operation to obtain a value of optimum base current in accordance with the value of the collector current and, and transmits the result of the operation to the control device 8 as a current command value signal. In the driving circuit 100, the current detector 9 detects the output current of the driving circuit 100 and applies a corresponding current signal to the control device 8. On the basis of the current command value signal and the actual current signal from the current detector 9, the control device 8 generates a control signal for controlling the ON /OFF operations of the switching element 12 and the auxiliary rectifying element 14 to make the output current of the driving circuit 100 correspond to the current command value. The base current of the transistor 5 is thereby controlled in accordance with the value of the collector current to minimize the loss. This enables a control to minimize at any time the sum of the conduction loss caused by voltage drop between the collector/emitter and the drive power spent for the ON/OFF drive of the transistor 5.

Figure 3:
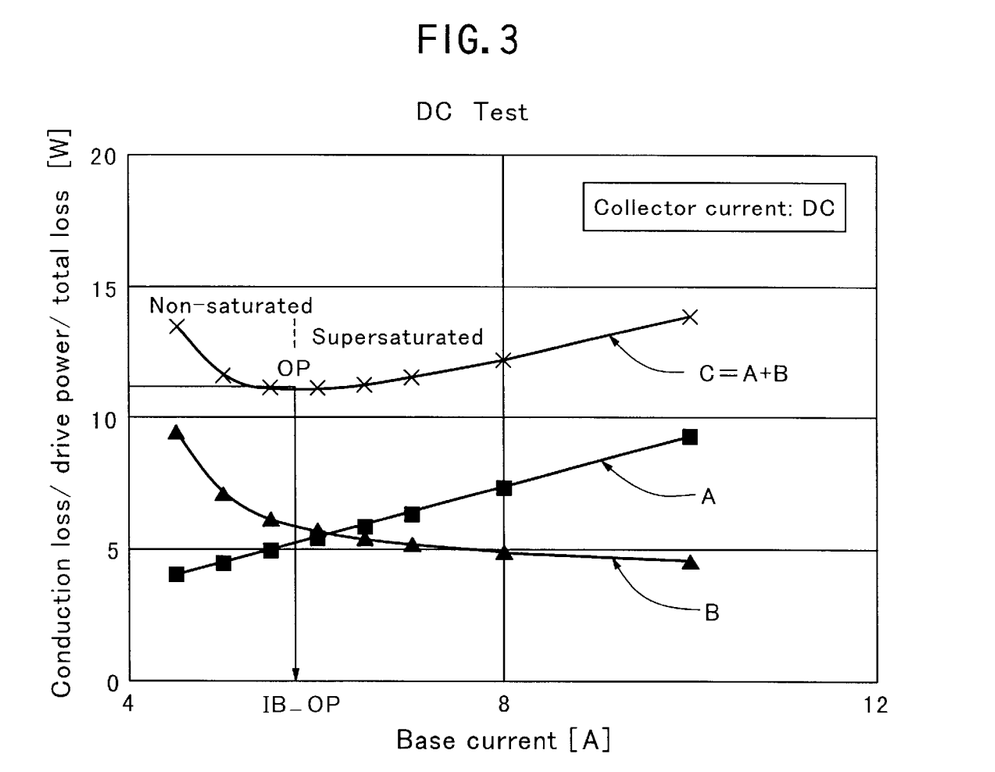
FIG. 3 is a diagram showing a relationship between base current and loss under a constant current in a transistor.

FIG. 3 is a diagram showing the relationship among the base current, the conduction loss between the collector and the emitter, and the drive power, in the case where the transistor 5 is in ON condition and the collector current is maintained constant. In FIG. 3, the abscissa indicates the base current and the ordinate indicates the conduction loss or the drive power. The line A indicates the drive power and the line B indicates the induction loss. The line C indicates the sum of the drive power and the conduction loss. The summed value will hereinafter be referred as "transistor loss". As seen in FIG. 1, under a particular value of the collector current, there is a range (OP) of the base current in which the transistor loss becomes minimum.

Figure 4:
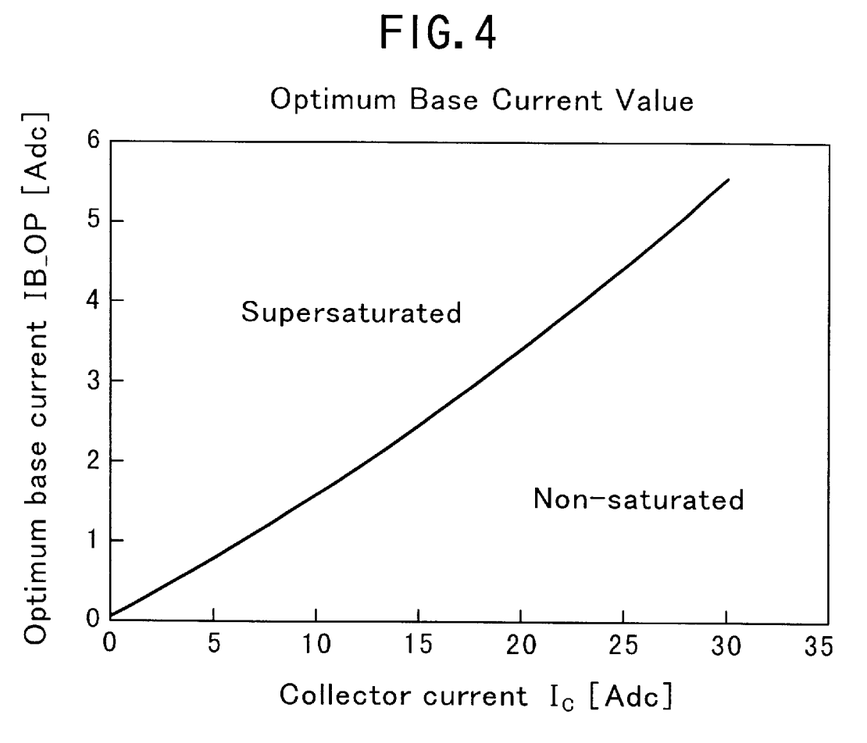
FIG. 4 is a diagram showing a relationship between collector current and optimum base current in a transistor.

FIG. 4 shows values of the optimum base current with which the transistor loss becomes minimum with respect to values of the collector current. The current command value operating device 7 in the driving circuit shown in FIG. 1 and FIG. 2 stores a data corresponding to this curved line in a memory in advance. The value of the optimum base current is read out from this data in accordance with the value of the collector current which is detected by the current detector 6. When variations of current amplification factor is to be considered, the readout data may be modified to obtain a current command data. In any case, the sum of the condition loss in the ON condition of the transistor and the drive power can be minimized by the aforementioned control of the base current.

The operation in OFF condition of the transistor 5 will be described below. In the OFF condition, the shunt switch 2 is, firstly, turned on so that the current from the current source 1 is bypassed from the switching circuit 3. Then, in the switching circuit 3, the positive side switch 31 is turned off and the negative side switch is turned on. In this condition, the transistor 5 is retained in the reverse biased condition by the reverse bias power supply 4 so that accumulated charge in the transistor 5 can be extracted in a short period of time, which enables the OFF operation speed to be increased and the margin for noise to be enlarged. When the switching circuit 3 is switched from the On condition to the OFF condition, the shunt switch 2 acts to make energy accumulated in the inductor 15 bypass so as to prevent over-voltage in the driving circuit 100. The switching element 12 and auxiliary rectifying element 14 of the current source 1 is turned off by the signal from the control device 8.

Figure 5A:
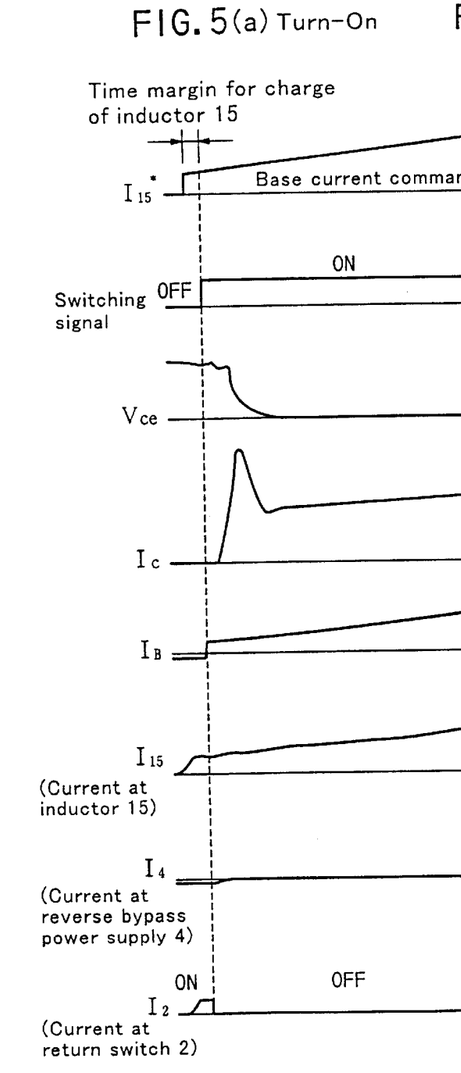
FIGS. 5(a) and 5(b) are diagrams showing waveforms of respective portions at turn-on and turn-off of a switching element in embodiments of the present invention.
Figure 5B:
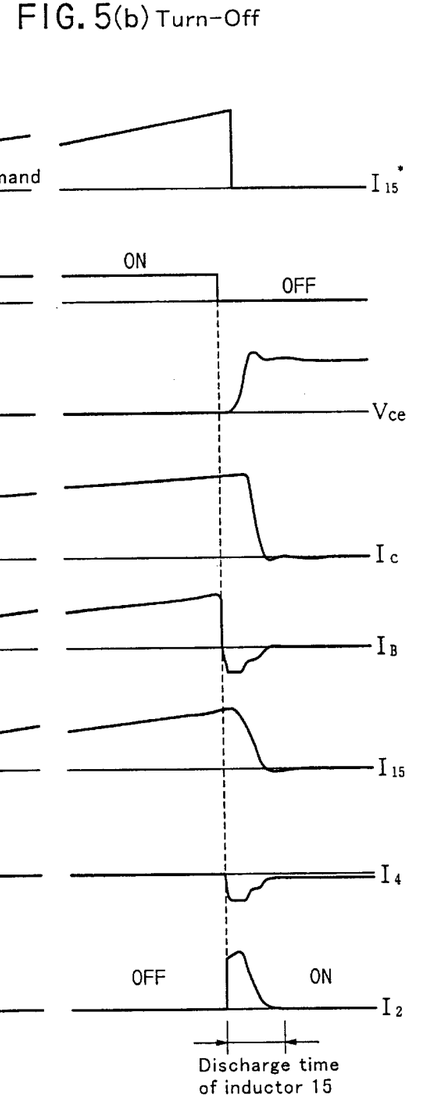

The switching operation will now be described below. In FIG. 5, there is shown waveforms in respective portions in the driving circuit 100 in the case where the transistor 5 is turned on and turned off. In the OFF condition of the transistor 5, when a signal for turning on the transistor is applied, the switching element 12 and the auxiliary rectifying element 14 are firstly turned on and the inductor 15 is started to be charged. When the inductor 15 is fully charged, a reverse signal is applied to the switching circuit 3. At this point, the shunt switch 2 is turned off. Since the inductor 15 acts in similar fashion to the current source, the base potential of the transistor 5 is sharply raised and the current is rapidly applied to the transistor 5. Thus, the turn-on speed of the transistor 5 can be increased.

When a turn-off signal is provided to the transistor 5 which is in the ON condition, the shunt switch 2 is turned on, with the result that the base current of the transistor 5 is immediately cut off. At the same time, the switching circuit 3 is reversed and a reverse bias is applied to the base 52 of the transistor 5. In the current source 1, the switching element 12 and the auxiliary rectifying elements 14 may be retained in the condition where a constant current is applied to these elements or may otherwise be cut off by any suitable means. The energy accumulated in the inductor 15 is consumed by the shunt switch 2 and the diode providing the rectifying element 13. This leads to the loss of the driving circuits 100, however, since the driving circuit is driven under a high frequency, the inductor 15 may be of a small inductance to make the loss small.

Thus, according to the aforementioned embodiment of the present invention, an arithmetical operation is performed to obtain an optimum base current in accordance with the value of the collector current of the transistor 5 to control the driving circuit. Therefore, the sum of the conduction loss between the collector/emitter and the drive power in the transistor 5 can be minimized. Further, since the switching element 12 and the auxiliary rectifying element 14 of the current source 1 can be driven under a high frequency of several hundred KHz and more, components of the driving circuit 100 including the inductor 15 can significantly be reduced in size and thereby the driving circuit 100 itself can be reduced in size. Since the base current of the transistor 5 is applied from the variable current type driving circuit, continuous driving current can be applied and the transistor 5 acting as a switching element can be retained in ON condition or OFF condition over an extended time period. Further, the transistor 5 may also be driven by a direct current or under an extremely low frequency. The voltage drop between the base and the collector of the transistor 5 used as the switching element is of a low value, such as about 1V. Besides, if a suitable switching element, such as FET, is used for the auxiliary rectifying element 14 in the current source of the driving circuit, the loss of the driving circuit 100 can additionally be reduced by virtue of the synchronous rectifying function thereof. Since the output voltage of the driving circuit 100 can be as low as about 1V, the voltage in the driving circuit can also be very low, for example, it can be several V at the lowest. Further, since it is possible to use an element having a low withstand voltage and a low state resistance, such as FET, as the switching element 12 and the auxiliary rectifying element 14, the loss in the driving circuit can further be reduced.

While the transistor 5 has been described as a type having a collector, base 52 and emitter 53 in the foregoing description, in the case where a bipolar-mode static-induction transistor (BSIT) is, for example, used as the switching element, the parts corresponding to the collector, base and emitter are referred as a drain, gate and source, respectively. The control device 8 may be of a digital form, or alternatively, may be embodied as an analog circuit including analog components, such as operational amplifiers and comparators.

Figure 6:
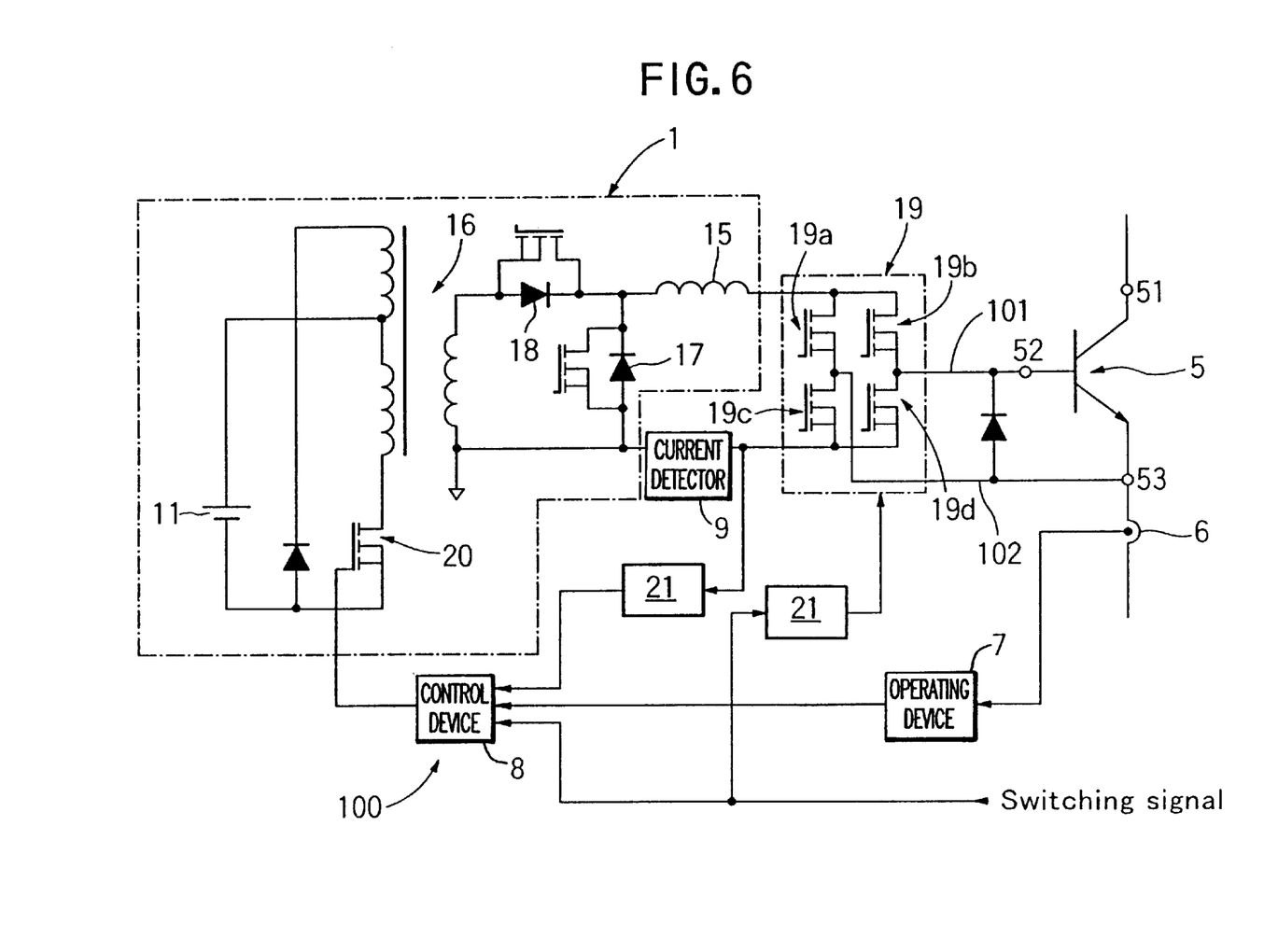
FIG. 6 is a circuit diagram showing a driving circuit according to a second embodiment of the present invention.

A second embodiment of the present invention is shown in FIG. 6. In the circuit shown in this FIG. 6, components corresponding to those shown in FIG. 1 and FIG. 2 are designated by the same reference numerals and detailed descriptions will be omitted. In the circuit of FIG. 6, the current source 1 includes a transformer 16 which is connected to the voltage source 11. A switching element 20 is connected to a primary winding of the transformer 16, while a secondary winding of the transformer is connected to the inductor 15 through rectifying elements 17, 18. The rectifying elements 17, 18 may be configured by a diode and a switching element which are connected in parallel each other, as in the case of the rectifying elements 13, 14 in the circuit of FIG. 2. A circuit 19 composed of four bridge-connected switching elements 19a, 19b, 19c, 19d is provided and constitutes an on-off switching circuit. The output of the circuit 19 is connected to the output main line 101 and the output return line 102 of the driving circuit 100. In the circuit shown in FIG. 6, power transmission is performed through the transformer 16 and various signals are transmitted by using insulated components, such as pulse transformers and photo couplers, which enables to electrically insulate the driving circuit 100 from the transistor 5. In an actual power conversion device, it is often the case that the switching circuit is constituted by a plurality of bridge-connected switching elements, such as transistors 5. Therefore, an insulated driving circuit is required for each transistor due to varying emitter potential of the transistor 5. The driving circuit of FIG. 6 may be used for this purpose. When an insulated DC voltage source can be used for each driving circuit, the driving circuit having a non-insulated circuitry shown in FIG. 2 may be used.

Figure 7:
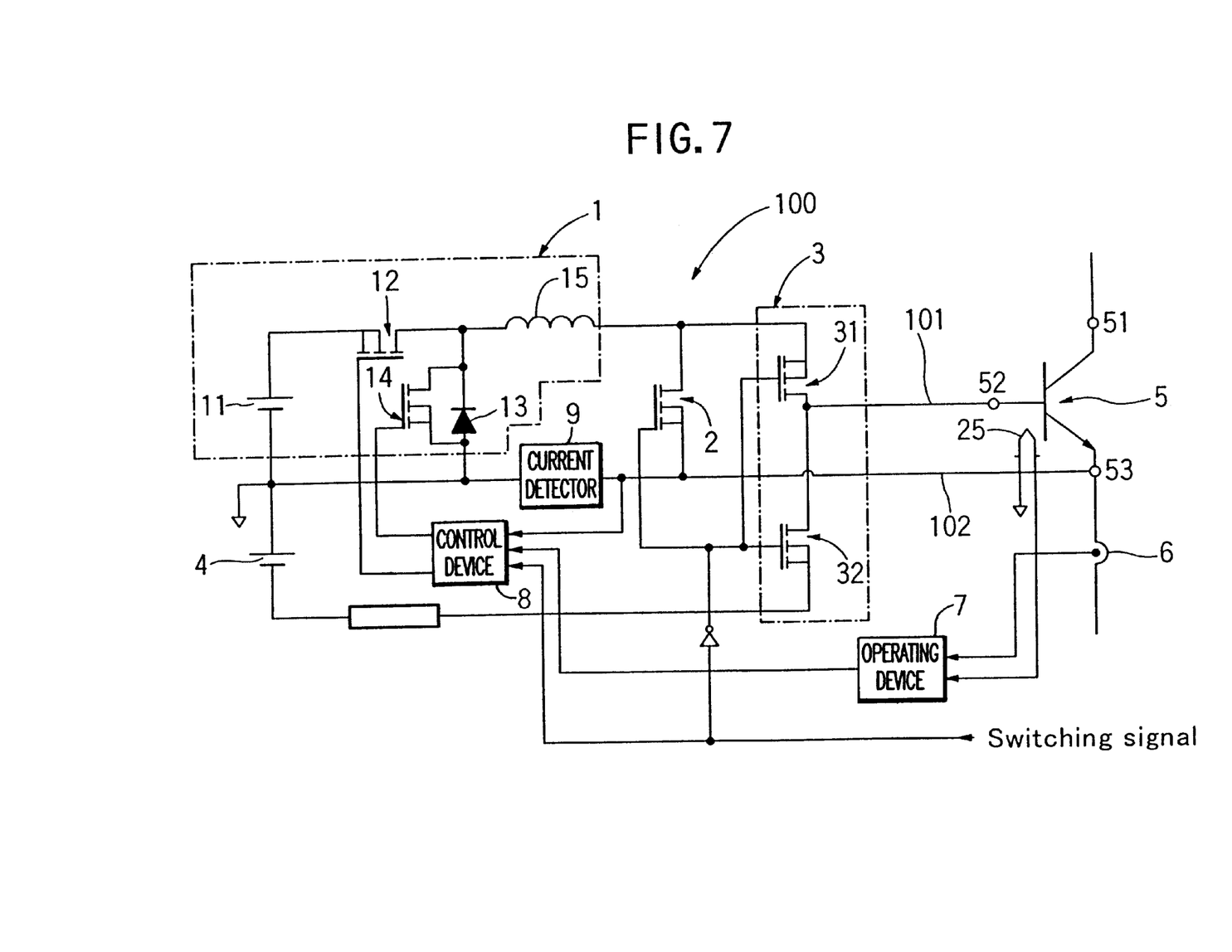
FIG. 7 is a circuit diagram showing a driving circuit according to another embodiment of the present invention.
Figure 8:
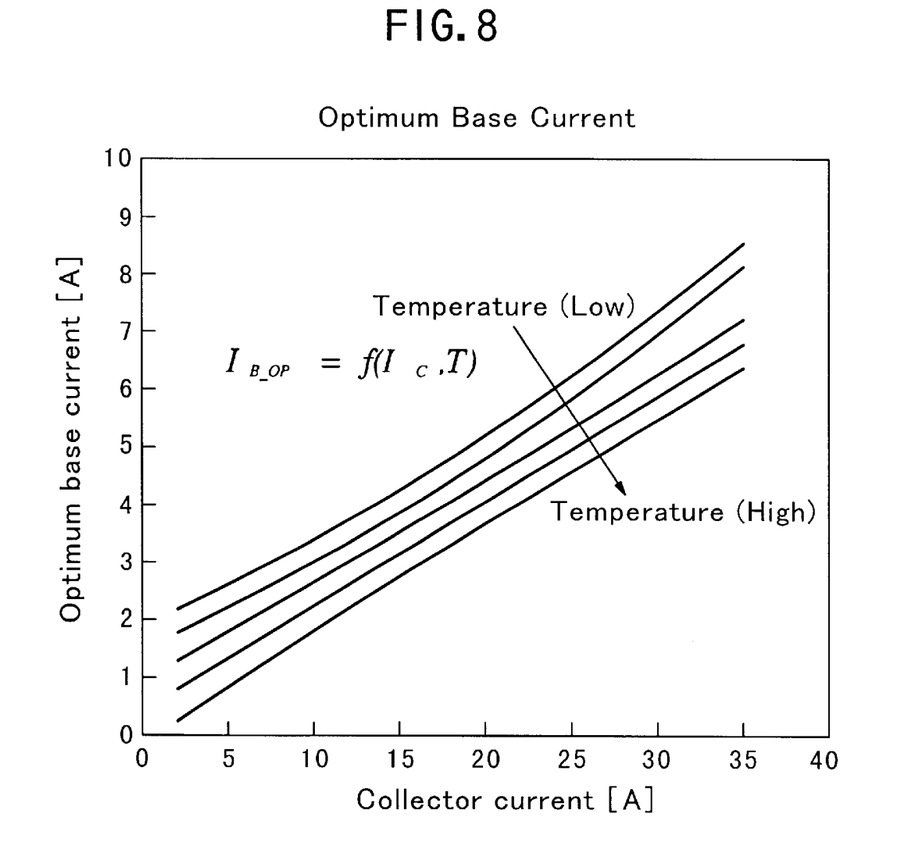
FIG. 8 is a diagram showing a relationship between collector current and optimum base current in a transistor, with respect to various different temperatures.

FIG. 7 shows an embodiment of the present invention which provides a temperature compensating function. Current amplification gain of transistors generally tends to be changed substantially in accordance with a change in temperature. This tendency is particularly significant in the range where the collector current is small. The circuit of FIG. 7 aims to deal with this characteristic of transistors and, for this purpose, there is provided a temperature detector 25 for detecting the temperature of the transistor 5. FIG. 8 shows optimum base current curves corresponding to the curve shown in FIG. 4 but obtained under various different temperatures. The circuit of FIG. 7 stores the data shown in FIG. 8 in advance. The circuit performs an arithmetical operation to determine an optimum base current value in accordance with the collector current by selecting one of the curves corresponding to the temperature which is based on the temperature signal from the temperature detector 25.

Figure 9:
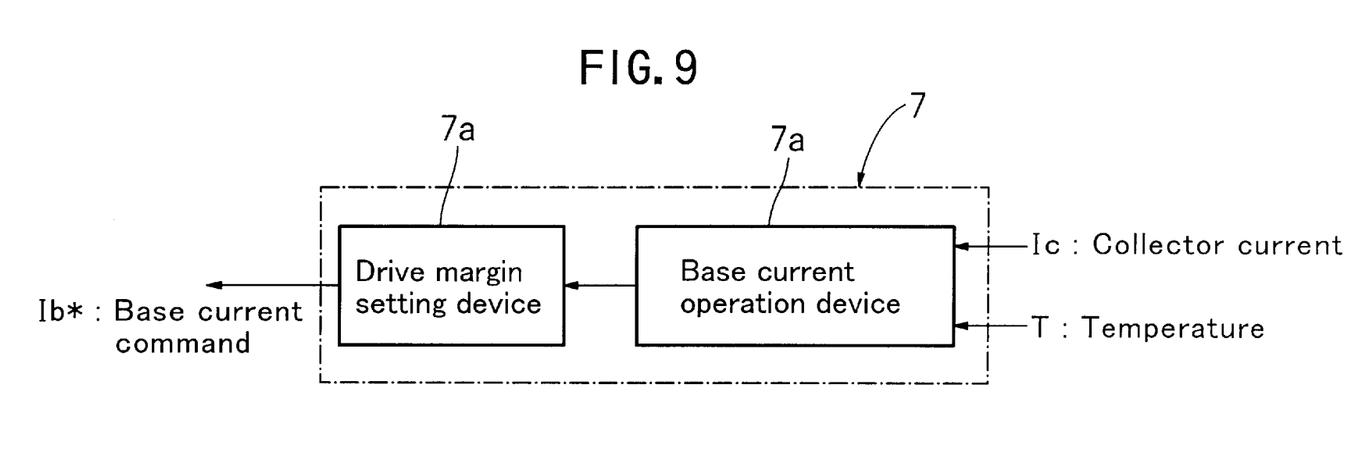
FIG. 9 is a block diagram showing a circuitry of a current command value operator in the driving circuit of FIG. 7.

FIG. 9 schematically shows in a block diagram the current command value operating device 7 in FIG. 7. The operating device 7 includes a base current operation device 7a and a drive margin setting device 7b. The base current operation device 7a determines an optimum base current value from the curve of FIG. 8 with collector current signal and temperature signal as inputs thereof. An output of the base current operation device 7a is introduced to the drive margin setting device 7b. The drive margin setting device 7b is provided for dealing with the possible problem of drive power shortage which may be caused by variations of transistor characteristic and detecting error of the current detector. The drive margin setting device 7b acts to set a base current value having a margin by multiplying the output of the base current operation device 7a by a coefficient greater than 1, or adding a constant current value to the base current operation device 7a.

Figure 10:
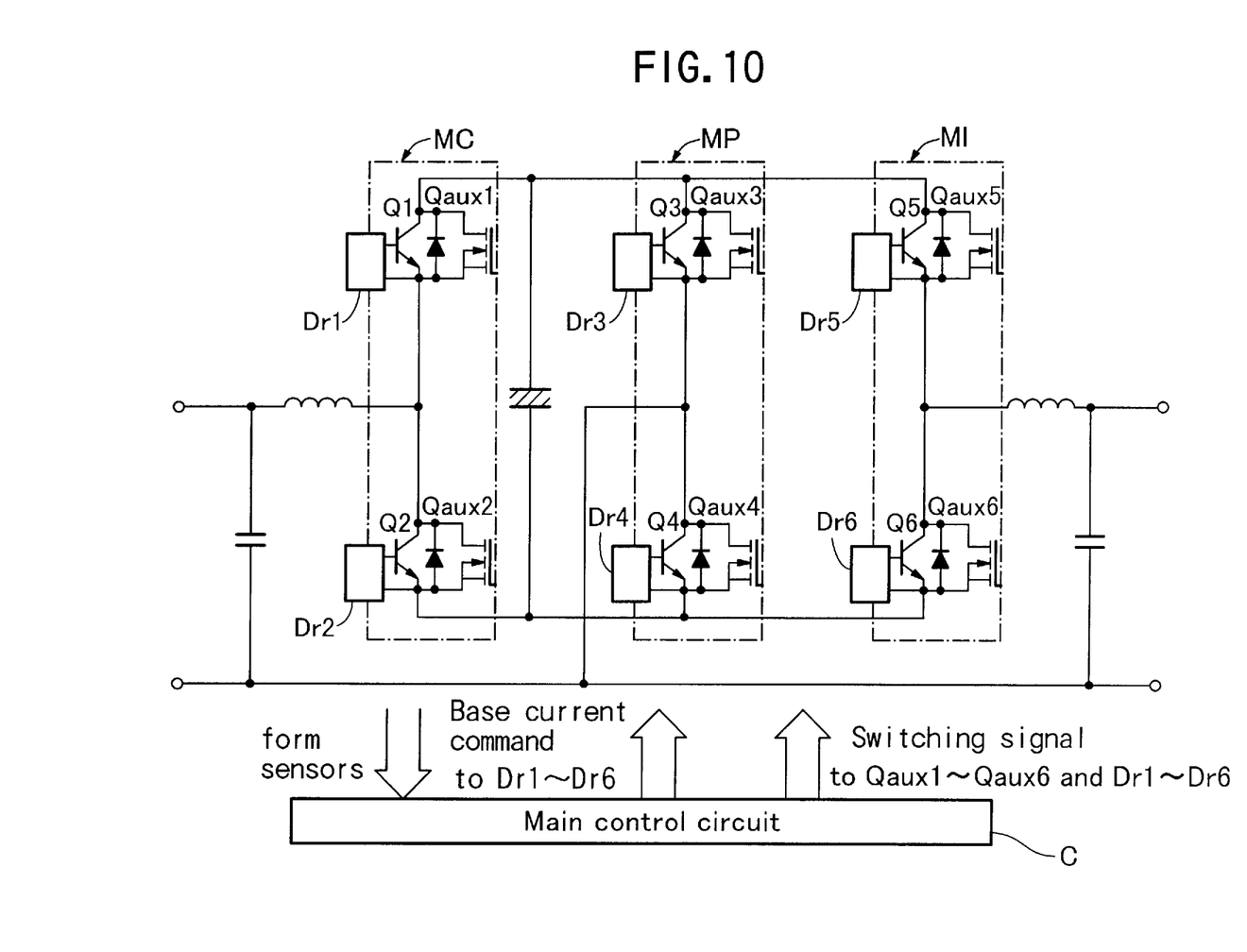
FIG. 10 is a circuit diagram of a power conversion device showing a example in which a driving circuit of the present invention is applied to the power conversion device.

FIG. 10 shows a fundamental part of the circuit of a rectifying device and an inversion device which are used in uninterruptible power supplies adopting the driving circuit of the present invention. The circuit has conventionally been well-known and detailed descriptions will be omitted. The circuit comprises an converter MC composed of transistors Q1, Q2 and auxiliary switching devices Qaux1, Qaux2 which are connected in parallel respectively to the transistors Q1, Q2, a inverter MI composed of transistors Q5, Q6 and auxiliary switching devices Qaux5, Qaux6 which are connected in parallel respectively to the transistors Q5, Q6, and a polarity switching arm MP disposed between the inverter MI and the converter MC. The polarity change arm MP comprises transistors Q3, Q4 and auxiliary switching devices Qaux3, Qaux4 which are connected in parallel respectively to the transistors Q3, Q4. This circuit constitutes an input/output synchronized type non-insulated CVCF device. The inverter Mi and converter MC are driven by PWM to form waves of input current and output voltage, and the polarity switching arm MP is driven by commercial voltage frequency of 50 or 60 Hz.

The transistors used in this circuit are current control semiconductor switching elements. The auxiliary switching device is provided to compensate for slow switching speed of the current control switching element. This feature itself has been disclosed in the aforementioned article in the Transactions of the Institute of Electrical Engineering of Japan described above. In FIG. 10, reference characters Dr1 to Dr6 designates driving circuits configured according to the present invention. The driving circuit shown in FIG. 6 may be used for the driving circuit. When an insulated current source can be used, a driving circuit having non-insulated circuitry as shown in FIG. 2 can also be used. Not only the circuit of the type shown in FIG. 10, power conversion devices in general are provided with a current detector for various purposes so that the collector current of each transistor can be detected in real time basis. Therefore, when the driving circuit of the present invention is applied to an actual power conversion device, it is unnecessary to provide any additional current detector in the driving device. Further, either or both of the current command value operating device 7 and the control device 8 can be mounted in a main control circuit C provided in the power conversion device.

What is claimed is:

1. In a power conversion device including a current control type semiconductor switching element having a collector or drain, an emitter or source, and a base or gate, a driving device for said switching element comprising:

an output main line connected to said base or gate of said switching element;

an output return line connected to said emitter or source;

a collector current detecting device for detecting a collector current or drain current and producing a collector current signal; and a base current control device for controlling a base current or gate current, wherein said base current control device is adapted to control the base current to reduce the sum of conduction loss and drive power in said switching element in accordance with said collector current signal from said collector current detecting device.

2. A driving device as defined in claim 1, further comprising:

1 an element-drive power supply for applying a current which is used for driving said switching element; and a reverse bias power supply for providing a reverse bias to said base or gate of said switching element, wherein said base current control device includes an ON-drive switch device for connecting said element-drive power supply to said base or gate of said switching element, an OFF-drive switch device for connecting said reverse bias power supply to said base or gate of said switching element, an operating device for performing an arithmetical operation to determine the base current by receiving the collector current signal from said collector current detecting device, wherein said ON-drive switch device is held in a conducting state and said OFF-drive switch device is held in a non-conductive state when the switching element is to be turned on, and said OFF-drive switch device is held in a conducting state and said ON-drive switch device is held in a non-conductive state when the switching element is to be turned off, whereby the reverse bias from said reverse bias power supply is applied for a rapid OFF operation of said switching element.

3. A driving device as defined in claim 1, wherein said base current control device stores data for optimum base current corresponding to various values of the collector current which is peculiar to said switching element, and includes a base current determining device for determining a base current value on the basis of the stored data, in accordance with the collector current signal from said collector current detecting device, a current control device being provided for applying the base current to said base or gate of said switching element in accordance with a signal from said base current determining device.

4. A driving device as defined in claim 3, wherein said base current control device stores data for optimum base current corresponding to various different temperatures, and said driving device further includes a temperature detecting device for detecting a temperature of said switching element, wherein said determining device of said base current control device determines the base current value, on the basis of the stored data, in accordance with the collector current signal from said collector current detecting device and a temperature signal from said temperature detecting device.

5. A driving device of said switching element as defined in claim 3, wherein said determining device performs an arithmetical operation to determine the base current which minimizes the sum of conduction loss and drive power of said switching element and then multiplies the value thus obtained by a coefficient greater than 1 to provide an output to said current control device.

6. A driving device as defined in claim 3, wherein said determining device performs an arithmetical operation to determine the base current which minimizes the sum of conduction loss and drive power of said switching element and then adds a constant current value to the value thus obtained to provide an output to said current control device.

7. A driving device of said switching element as defined in claim 3, wherein said determining device performs an arithmetical operation to determine the base current which minimizes the sum of conduction loss and drive power of said switching element and then multiplies the value thus obtained by a coefficient greater than 1 and adds a constant current value thereto to provide an output to said current control device.

8. A driving device as defined in anyone of claim 3, wherein said current control device includes a switch device for controlling the base current of said switching element and a rectifying device provided in an output portion of said switch device, said rectifying device being of a synchronous type which includes a rectifying element and an auxiliary rectifying element which has lower conduction resistance than said switch device.

9. A driving device as defined in anyone of claim 1, further comprising a base current detecting device for detecting the base current of said switching element, said base current detecting device being adapted to regulate a base current signal from said base current control device in accordance with a base current command signal which is obtained in accordance with the collector current signal from said collector current detecting device.

* * * * *